United States Patent

Akram et al.

[11] Patent Number: 5,998,274
[45] Date of Patent: Dec. 7, 1999

[54] METHOD OF FORMING A MULTIPLE IMPLANT LIGHTLY DOPED DRAIN (MILDD) FIELD EFFECT TRANSISTOR

[75] Inventors: Salman Akram; Akram Ditali, both of Boise, Id.

[73] Assignee: Micron Technology, Inc., Boise, Id.

[21] Appl. No.: 09/172,439

[22] Filed: Oct. 14, 1998

Related U.S. Application Data

[62] Division of application No. 08/843,626, Apr. 10, 1997, Pat. No. 5,886,460.

[51] Int. Cl.$^6$ .................................................. H01L 21/265
[52] U.S. Cl. ........................... 438/306; 438/297; 438/302; 438/231; 257/335
[58] Field of Search .................................. 438/231, 302, 438/306, 257, 297, 305, 274; 251/335

[56] References Cited

U.S. PATENT DOCUMENTS

| | | |
|---|---|---|
| 4,356,623 | 11/1982 | Hunter . |
| 4,786,609 | 11/1988 | Chen . |
| 5,147,811 | 9/1992 | Sakagami ................................. 438/302 |
| 5,171,700 | 12/1992 | Zamajian . |
| 5,183,771 | 2/1993 | Mitsui et al. . |
| 5,376,566 | 12/1994 | Gonzalez . |
| 5,382,533 | 1/1995 | Ahmad et al. . |
| 5,393,683 | 2/1995 | Mathews et al. . |
| 5,405,791 | 4/1995 | Ahmad et al. . |
| 5,424,234 | 6/1995 | Kwon . |
| 5,441,906 | 8/1995 | Burger . |
| 5,534,449 | 7/1996 | Dennison et al. ...................... 438/231 |
| 5,573,965 | 11/1996 | Chen et al. ............................. 438/297 |
| 5,620,919 | 4/1997 | Godinho et al. . |
| 5,677,224 | 10/1997 | Kadosh et al. .......................... 257/274 |
| 5,705,439 | 1/1998 | Chang . |

*Primary Examiner*—Charles Bowers
*Assistant Examiner*—David S Blum
*Attorney, Agent, or Firm*—Reed Smith Shaw & McClay LLP

[57] ABSTRACT

A multiple implant lightly doped drain ("MILDD") field effect transistor is disclosed. The transistor includes a channel, a gate, a dielectric structure that separates the gate from the channel, a source region and a drain region. The drain region has a first drain subregion, a second drain subregion and a third drain subregion. Each drain subregion has a dopant concentration that differs from that of the other two drain subregions. A method of forming the same is also disclosed.

2 Claims, 9 Drawing Sheets

METHOD OF FORMING A MULTIPLE IMPLANT LIGHTLY DOPED DRAIN (MILDD) FIELD EFFECT TRANSISTOR

This application is a divisional of application application Ser. No. 08/843,626 filed on Apr. 10, 1997 now U.S. Pat. No. 5,886,460.

TECHNICAL FIELD

The present invention relates to integrated circuit devices and, more particularly, to a multiple implant lightly doped drain ("MILDD") field effect transistor and method of forming the same.

BACKGROUND

Field Effect Transistors ("FETs") continue to be the devices of choice in the fabrication of high density integrated circuits. In particular, manufacturers have scaled down FET circuit features to the sub-quarter micron level to achieve the high densities required for gigabit Dynamic Random Access Memories (DRAMs). The reduction of device dimensions results in a number of short-channel effects. One short-channel effect that poses a primary obstacle to further reductions in scale is the "hot-carrier effect."

In an N-channel FET, the hot-carrier effect occurs when the voltage applied between the drain and source regions of the transistor increases to a level at which the high lateral electric field in the transistor channel induces impact ionization. During impact ionization, some electrons are accelerated from the source region to the drain region and collide with the silicon crystal lattice with sufficient kinetic energy to break chemical bonds in the lattice within the channel region of the transistor.

As a result, free hole-electron carrier pairs are generated. The free holes are attracted to the negatively-biased substrate, resulting in a substantial increase in substrate current. At the same time, the free electrons are attracted to the positively-biased transistor gate. Although most of the free electrons completely traverse the gate dielectric layer, some become trapped within the dielectric layer. While the channel-to-substrate and channel-to-gate current increases power dissipation, the injection and trapping of electrons in the gate dielectric is far more serious because it causes the threshold voltage to increase and the current drivability to decrease.

During the operational life of the device, more and more electrons become trapped, resulting in a cumulative degradation of device performance. Over time, the threshold voltage and current drivability characteristics may be degraded to levels that render the circuit inoperable.

Although an analogous process takes place in P-channel devices, it is of less concern in practical applications. In a P-channel device, holes, instead of electrons, are injected into and become trapped within the gate dielectric. The energy that must be imparted to a hole to cause it to be injected into the gate dielectric is substantially greater than the energy required for electron injection. The lower hole mobility further reduces this effect. Far fewer carriers become trapped in a P-channel device, as compared to an N-channel device operating under similar conditions. As a result, the hot-carrier effect is not as critical for P-channel devices. Accordingly, the discussion below focuses on N-channel devices, with the implicit assumption that analogous principles apply to P-channel devices.

As channel lengths, along with other device dimensions, decrease, the supply voltage does not decrease proportionately. As a result, the lateral electric field in the channel is stronger for a given applied voltage. The stronger lateral field makes the hot-carrier effect more pronounced. Accordingly, integrated circuit designers strive to reduce the hot-carrier effect in sub-quarter micron scale devices, while not degrading current drivability.

In the past decade, designers have taken a number of approaches to mitigate the hot-carrier effect, including: (1) increasing the resistance of gate oxide at the silicon ("Si")— silicon dioxide ("SiO$_2$") interface through improved methods of dielectric processing, see Mathews et al., U.S. Pat. No. 5,393,683 (U.S. Class 437/ 42), issued Feb. 28, 1995, entitled "METHOD OF MAKING SEMICONDUCTOR DEVICES HAVING TWO-LAYER GATE STRUCTURE"; (2) reducing the power supply voltage to reduce the magnitude of the lateral fields, an often difficult or impossible approach; (3) utilizing Lightly-Doped Drain ("LDD") FETs; and (4) utilizing other field-reducing device structures.

The most prevalent approach is to use standard LDD FETs. With this approach, the drain and source regions are doped with two different implants, one self-aligned to the gate electrode and the other self-aligned to a sidewall spacer, which permits the implant to be offset from the gate edge. Although this structure results in smaller lateral fields, it often leads to reduced drive currents. Disadvantages of conventional LDD FETs include: (1) increased series resistance between the drain and source regions resulting from the existence of a relatively large lightly-doped region adjacent to the channel; (2) spacer-induced degradation, resulting from the injection of carriers into the spacer at the spacer-substrate interface, which results in increased threshold voltage and reduced drive current. Designers have suggested several modifications of the conventional LDD structure to improve its electrical characteristics, with limited success. See, e.g., Ahmad et al., U.S. Pat. No. 5,405,791 (U.S. Class 437/34), issued Apr. 11, 1995, entitled "PROCESS FOR FABRICATING ULSI CMOS CIRCUITS USING A SINGLE POLYSILICON GATE LAYER AND DISPOSABLE SPACERS"; Ahmad et al., U.S. Pat. No. 5,382,533 (U.S. Class 437/ 24), issued Jan. 17, 1995, entitled "METHOD OF MANUFACTURING SMALL GEOMETRY MOS FIELD-EFFECT TRANSISTORS HAVING IMPROVED BARRIER LAYER TO HOT ELECTRON INJECTION"; Gonzalez, U.S. Pat. No. 5,376,566 (U.S. Class 437/35), issued Dec. 27, 1994, entitled "N-CHANNEL FIELD EFFECT TRANSISTOR HAVING AN OBLIQUE ARSENIC IMPLANT FOR LOWERED SERIES RESISTANCE".

SUMMARY OF THE INVENTION

The current invention provides a method and apparatus that both mitigates the hot-carrier effect and overcomes the drawbacks of the aforementioned structures. A new device structure, a Multiple-Implant Lightly-Doped Drain ("MILDD") FET, and a method of forming the same are disclosed. The transistor includes a channel, a gate, a dielectric structure that separates the gate from the channel, a source region and a drain region. One or both of the source and drain regions have a first subregion, a second subregion and a third subregion. Each subregion has a dopant concentration that differs from that of the other two subregions in the corresponding region.

The advantages of the present invention over conventional LDD structures are numerous and include the following: (1) reduced peak value of the lateral electric field by distributing the voltage drop over a larger portion of the drain and/or source regions; (2) reduced series resistance, i.e., increased drive current; (3) considerable suppression of gate-induced drain leakage ("GIDL"); (4) requirement of no additional masks; (5) use of conventional process steps; (6) reduction in device overlap capacitance, which can slow down device operation; (7) increase in punchthrough voltage, i.e., the minimum voltage at which the depletion regions of the source and drain overlap, thereby, creating a short; and (8) better overall device reliability due to mitigation of the hot-carrier effect.

DESCRIPTION OF THE PREFERRED EMBODIMENT

Figure 1A:
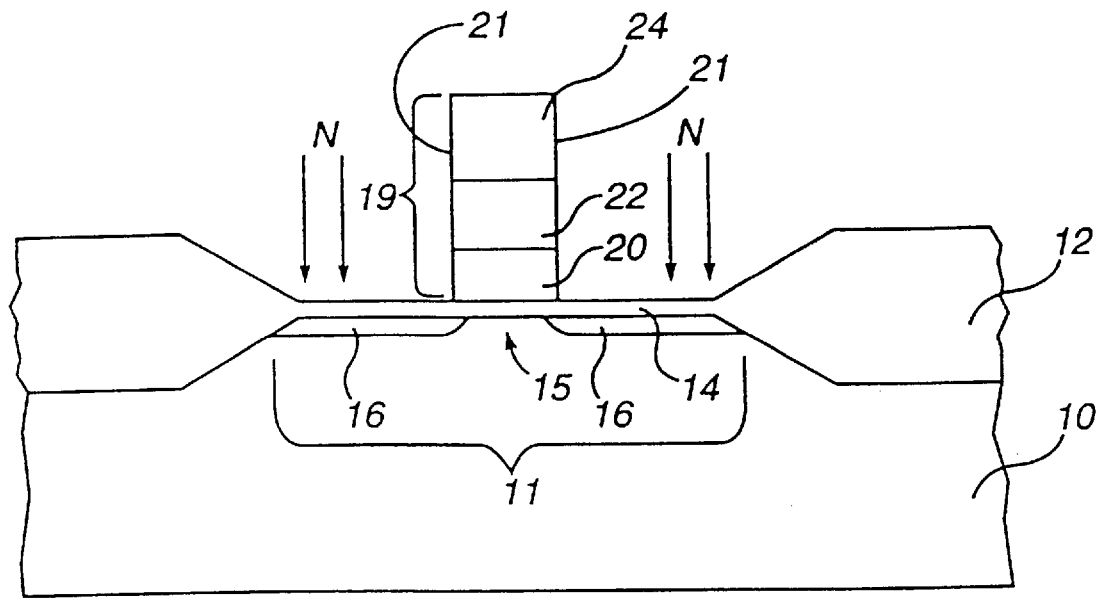
FIGS. 1(a)–1(d) are schematic cross-sectional views of a semiconductor wafer undergoing a process flow that utilizes three thin gate sidewall spacers to fabricate an embodiment of the present invention, each figure corresponding to a point in the process immediately subsequent to one of four introductions of N-type dopants into the wafer's substrate.

FIGS. 1(a)–1(d) depict a fabrication process for a FET that corresponds to a first embodiment of the present invention. Referring to FIG. 1(a), substrate 10 comprises a semiconductor material, e.g., single crystal silicon, polysilicon ("poly-Si") or amorphous silicon ("a-Si"). Substrate 10 has been doped with a P-type impurity, for example, boron. Field oxide 12 has been formed on substrate 10 to electrically isolate active area 11 from other active areas on the wafer. Field oxide 12 comprises $SiO_2$ and may be formed by any of several well-known methods, including the standard local oxidation of silicon ("LOCOS") process.

A thin layer of gate dielectric 14 is formed superjacent substrate 10 over active area 11. This invention is especially suitable for ultrathin gate dielectric 14 having a typical thickness of 80±20 angstroms. Typical gate dielectric 14 will comprise $SiO_2$ that has been formed using one of several well-known methods of forming $SiO_2$ that has a very low defect density. Gate dielectric 14 comprising several sublayers are also possible, e.g., a layer of silicon nitride ("$Si_3N_4$") sandwiched between two layers of $SiO_2$ (collectively referred to as "ONO"). In either case, the oxide may be thermally grown, e.g., utilizing rapid thermal oxidation ("RTO"), or deposited, e.g., utilizing chemical vapor deposition ("CVD") or plasma-enhanced chemical vapor deposition ("PECVD").

Subsequent to formation of the gate dielectric 14, a gate structure 19 is formed superjacent gate dielectric 14. Gate structure 19 has sidewalls 21. Gate structure 19 will typically comprise a polysilicon-metal-dielectric stack, for example, a layer of polysilicon 20 superjacent the gate dielectric 14 and having a thickness of approximately 1800 angstroms, a layer of tungsten silicide ("WSi") 22 superjacent the polysilicon layer 20 and having a thickness of approximately 1800 angstroms, and a $Si_3N_4$ cap 24 superjacent the WSi layer 22 and having a thickness of approximately 2400 angstroms. To further reduce the resistance of the metal layer, the single layer of WSi can be replaced with a first sublayer of WSi, not shown, superjacent the polysilicon layer 20 and second sublayer of tungsten ("W"), not shown, superjacent the WSi layer.

Each of the three layers 20, 22 and 24 is formed by first blanket depositing the appropriate material superjacent the wafer, using a photolithographic mask to define the location of each gate structure 19, and then etching the material from all locations on the wafer other than the location of each gate structure 19. The same mask can be used for all three layers because each of the three layers is aligned with the other two. The metal silicide layer 22 provides the gate structure with high conductivity. One of several alternatives to WSi would be titanium silicide ("$TiSi_2$"). The polysilicon layer 20 acts as a transition layer between two otherwise chemically incompatible layers, namely, the gate dielectric layer 14 and the metal silicide layer 22, and also results in improved electrical characteristics of the device. The dielectric cap 24 protects the gate structure 19 from subsequent processing steps. A nitride cap is preferred over a $SiO_2$ cap because a $SiO_2$ cap would be vulnerable to subsequent contact etches of $SiO_2$. Many other gate structures are possible.

Although the main purpose of the gate dielectric 14 is to prevent current flow between the gate structure 19 and the substrate 10, the gate dielectric 14 is left in place between the gate structure 19 and the field oxide 12 to protect the surface of the substrate 10 from subsequent process steps so as to maintain the integrity of the surface. Additional oxide layers, not shown, can also be deposited to increase the thickness of gate dielectric 14 in areas where process steps, e.g., the introduction of dopants, are to be performed, e.g., by introducing the dopants into the surface of substrate 10. These additional layers can provide improved surface protection during implantation process steps, especially when the gate dielectric is relatively thin.

After the gate structure 19 is formed, an N-type dopant is introduced into substrate 10 at those locations on the wafer where the field oxide 12 and gate structures 19 do not act as barriers to the dopant. In this manner, N-type contact subregions 16 are formed in the P-type substrate 10 (source and drain regions are referred to generically as "contact regions" or contact subregions" hereinafter because one of the main purposes of the source and drain regions is to permit an ohmic contact to be made between external interconnect, not shown, and each side of the channel 15). The P-type region 15 of the substrate 10 that remains between the contact regions 16 is designated as the channel region 15. The terms "source" and "drain" refer to the flow of electrons when the transistor is turned "on" and is operating in its normal mode, in which case a positive bias is applied to the drain contact region, causing electrons to flow from the source contact region 16 to the drain contact region 16 via the channel region 15.

It can be appreciated that as the wafer is subjected to subsequent thermal processing steps, the N-type dopant in the contact subregions 16 continues to diffuse away from its points of introduction into the substrate 10. It is highly desirable that a manufacturer be able to control with some precision the depth and lateral profile, i.e., outer boundaries, of the contact regions 16 because the expansion of these regions can affect the ultimate design parameters of the transistor. Generally, shallow contact regions are preferred because they have to be scaled in accordance with lateral dimensions to maintain adequate device performance. Therefore, N-type dopants having low diffusion rates are preferred. Suitable N-type dopants include phosphorous ("P"), arsenic ("As") and antimony ("Sb"). As and Sb are preferred over P because they have especially low diffusion rates. As is preferred over Sb because the properties of As are more fully understood, although Sb has a lower diffusion rate than does As at temperatures lower than 1000° C. and also exhibits a lower autodoping effect.

The N-type dopant is preferably introduced into the substrate 10 by ion implantation. The energy of the implant could range approximately from 20 keV to 130 keV. The preferred energy would range approximately from 30 kev to 100 keV, depending on the desired junction depth. The dosage will depend on the dopant concentration that is desired at the edge of the gate structure 19 for the contact regions being created, which in turn will depend on the device performance and characteristics desired or required for the particular application.

Alternatively, the N-type dopant could be introduced into the substrate 10 by other known means, including plasma doping, in which ions in a plasma are driven into a substrate under the influence of an electrical field, and other diffusion doping methods.

In a conventional process flow, only one source region and one drain region are formed for each transistor. However, contact subregions 16 are merely the first of several source and drain subregions that are to be formed under the present invention. Accordingly, contact subregions 16 will be referred to as first contact subregions 16 hereinafter.

Figure 1B:
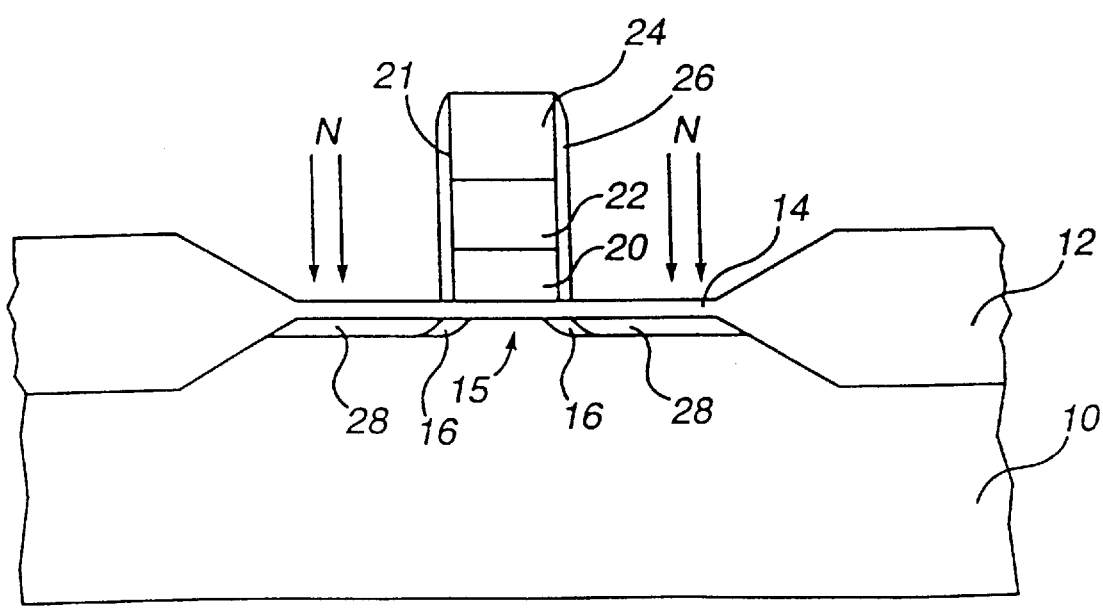

Referring to FIG. 1(b), first gate sidewall spacers 26 are formed adjacent to gate sidewalls 21. The first gate sidewall spacers 26 may comprise any dielectric, including $Si_3N_4$ or $SiO_2$. However, $Si_3N_4$ is preferably used because it will prevent etching of the spacer during subsequent oxide etch steps, e.g., contact etch steps. Nitride spacers 26 can be formed by blanket depositing a thin conformal layer of silicon nitride over the entire wafer and then anisotropically dry etching the entire wafer in the vertical direction. In this manner, all of the nitride layer is removed from the wafer except for the portions adjacent to the steep vertical sidewalls 21. A sidewall spacer 26 typically will have a thickness of approximately from 150 to 2000 angstroms.

The primary purpose of the first sidewall spacers 26 is to provide an offset for the subsequent introduction of N-type dopants into the substrate 10. An N-type dopant is introduced into the substrate 10 in one of the several ways discussed above with respect to the first contact subregions 16, with the same considerations applying. This second introduction of N-type dopants into the substrate 10 will create second contact subregions 28 in the substrate 10.

It can be appreciated from FIG. 1(b) that (1) a portion of the first contact subregions 16 occupy the same space as a portion, if not all, of the second contact subregions 28, (2) a portion of the first contact subregions 16 is closer to the gate structure 19 than is any portion of the second contact subregions 28, and (3) the N-type dopant concentration in the portions of the first contact subregions 16 that lie closest to the gate structure 19 is necessarily lower than the N-type dopant concentrations in the portions of the second contact subregions 28 that lie closest to the gate structure 19 because the latter portion has been doped during both introductions of N-type dopant, while the former portion has been doped only during the first introduction of N-type dopant. The third relationship is true even if the same dosage of dopant is introduced in both instances because the effects of separate dosages are cumulative. The doping profile can be controlled further by varying dosages.

Figure 1C:
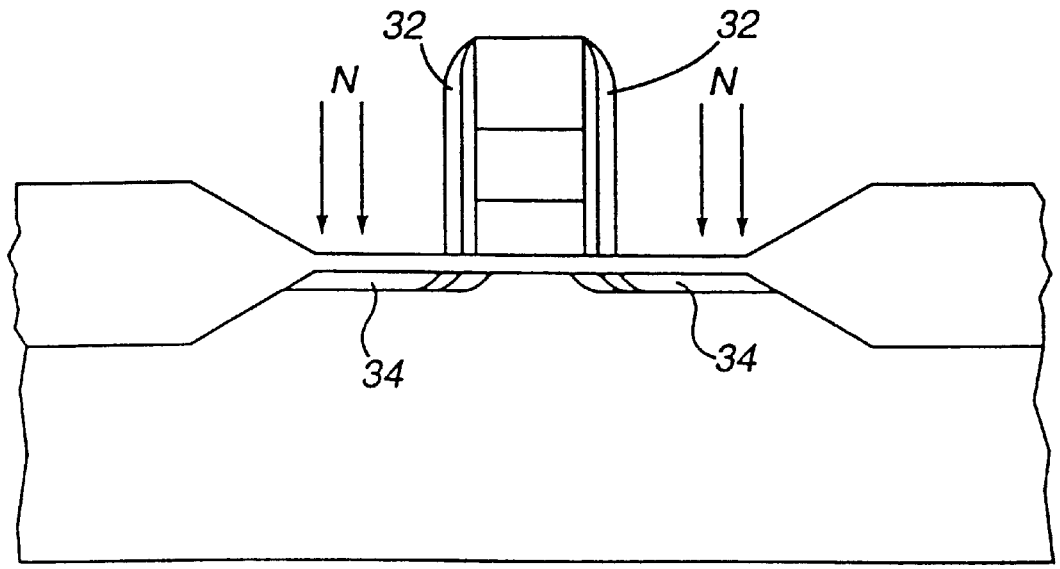

Referring to FIG. 1(c), second gate sidewall spacers 32 are formed adjacent to first gate sidewall spacers 26. The second gate sidewall spacers 32 are formed in the same way as were the first gate sidewall spacers 26 and serve the same purpose, namely, to provide an offset for the subsequent introduction of N-type dopants into the substrate 10. A third introduction of N-type dopant into the substrate 10 also has been accomplished, resulting in the creation of third contact subregions 34 in the substrate 10. It can be appreciated from FIG. 1(c) that the above-mentioned relationships between the first contact subregions 16 second contact subregions 28 also apply between second contact subregions 28 and third contact subregions 34.

Figure 1D:
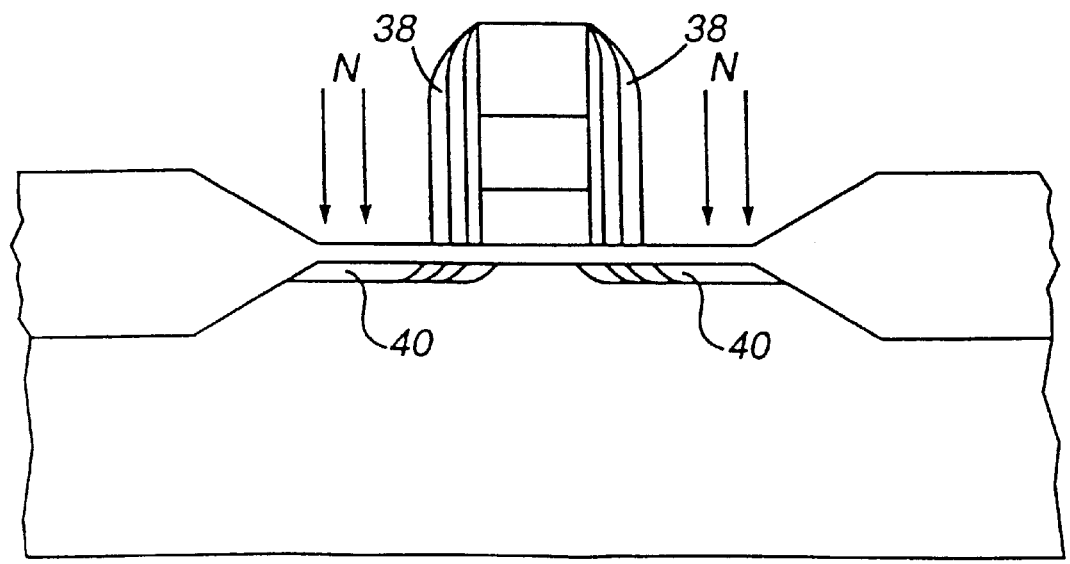

Finally, referring to FIG. 1(d), third gate sidewall spacers 38 are formed adjacent to second gate sidewall spacers 32. Moreover, a fourth introduction of N-type dopants into the substrate 10 also has been accomplished, resulting in the creation of fourth contact subregions 40 in the substrate 10.

Close to the interface between the substrate 10 and the gate dielectric 14, the dopant concentrations in the various contact subregions have the following relationship:

$$N_4 > N_3 > N_2 > N_1,$$

where $N_i$ (where i=1, 2, 3, 4, . . . ) is the N-type dopant concentration close to the interface in the i'th contact subregion. Typical dopant concentrations for $N_4$, $N_3$, $N_2$ and $N_1$ would be $1 \times 10^{20}$ cm$^{-3}$, $1 \times 10^{19}$, $1 \times 10^{18}$, and $1 \times 10^{17}$, respectively. If ion implantation is used, dosages of $5 \times 10^{13}$ to $5 \times 10^{15}$ cm$^{-2}$ would roughly correspond to these dopant concentrations. The energy for implant will depend on the thickness of gate dielectric 14 and the desired depth of the implanted regions. Standard annealing techniques are employed to electrically activate the dopants and remove damage. The subregions that lie farthest from the gate structure 19 at the interface are also the subregions with the highest dopant concentration. Ohmic contacts, not shown in the drawings, will subsequently be made with the subregions having the highest dopant concentrations because regions having higher dopant concentrations also have lower resistance.

Although FIGS. 1(a)–1(d) depict the creation of four contact subregions within each source and drain region, the benefits of the present invention can be achieved with the creation of as few as three contact subregions or as many contact subregions as device geometries and processing techniques, both present and future, do and will permit. The steps of forming the sidewall spacers and then introducing N-type dopants into the substrate is iterated as many times as required to achieve desired benefits. No masks, in addition to the one used to define the gate structure 19, are required. Lateral spacing of the contact subregions is controlled by varying the spacer thickness, which can be varied from one spacer to the next in the same device.

Figure 2A:
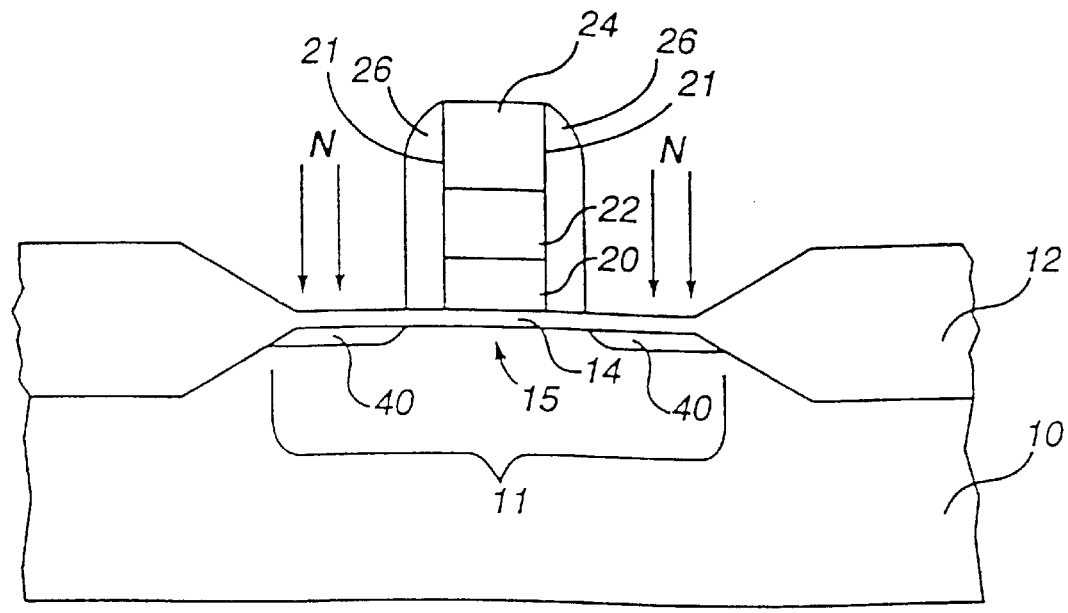
FIGS. 2(a)–2(d) are schematic cross-sectional views of a semiconductor wafer undergoing a process flow that utilizes one thick gate sidewall spacer to fabricate an embodiment of the present invention, each figure corresponding to a point in the process immediately subsequent to one of four introductions of N-type dopants into the wafer's substrate.
Figure 2B:
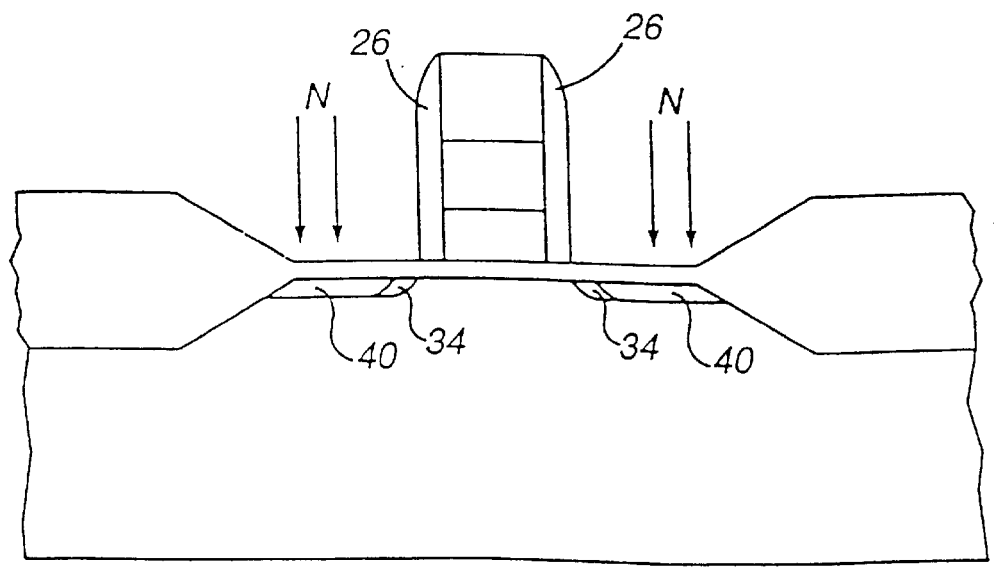
Figure 2C:
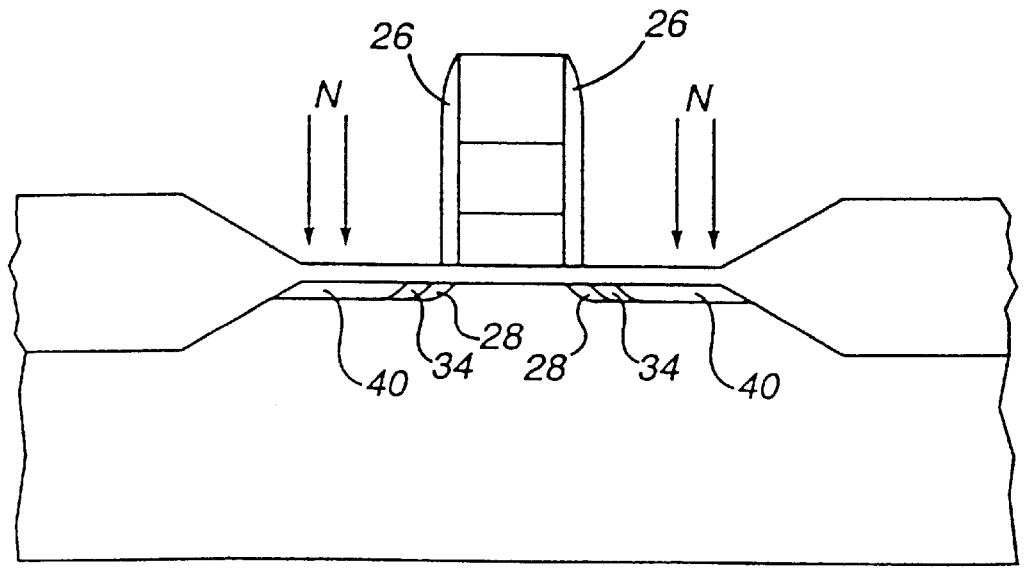
Figure 2D:
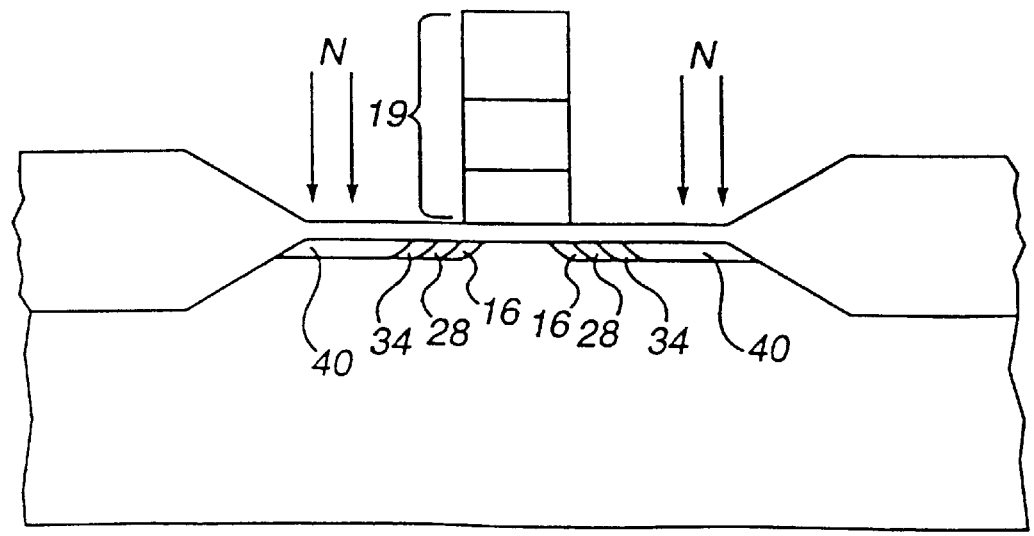
Figure 3A:
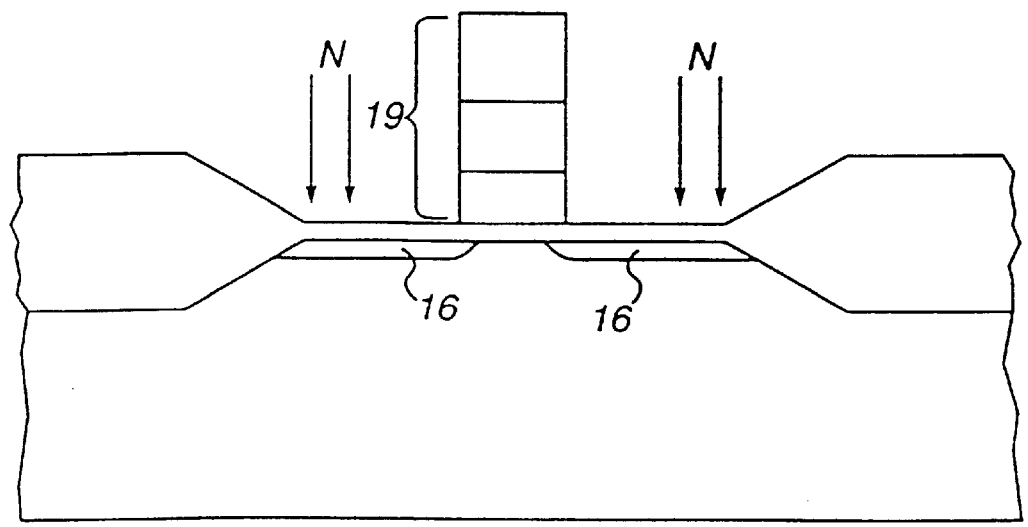
FIGS. 3(a)–3(d) are schematic cross-sectional views of a semiconductor wafer undergoing an alternative process flow that utilizes one thick gate sidewall spacer to fabricate an embodiment of the present invention, each figure corresponding to a point in the process immediately subsequent to one of four introductions of N-type dopants into the wafer's substrate.
Figure 3B:
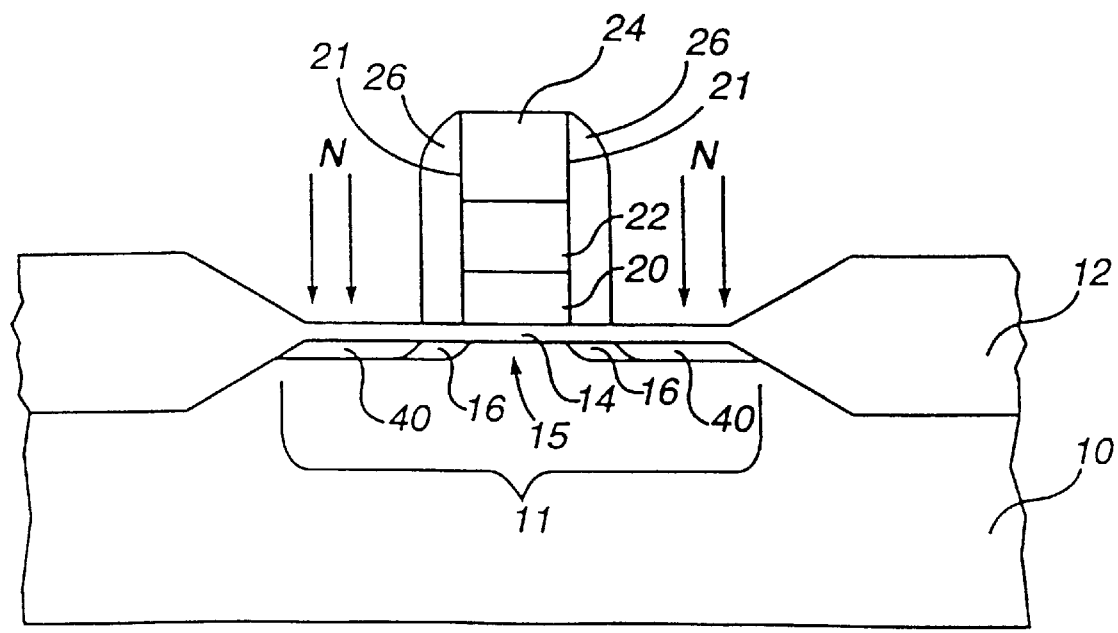
Figure 3C:
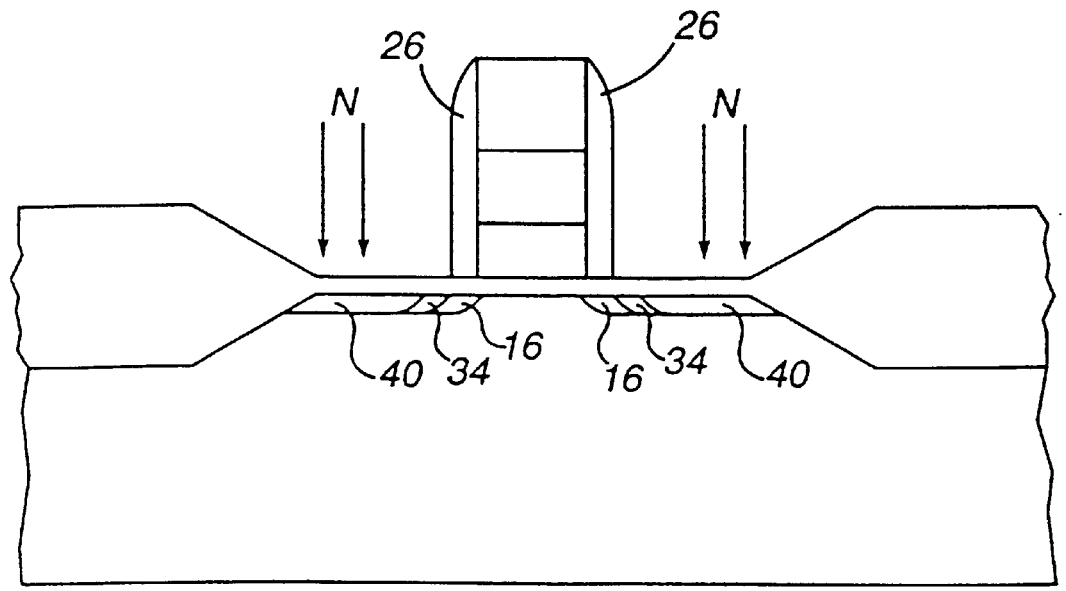
Figure 3D:
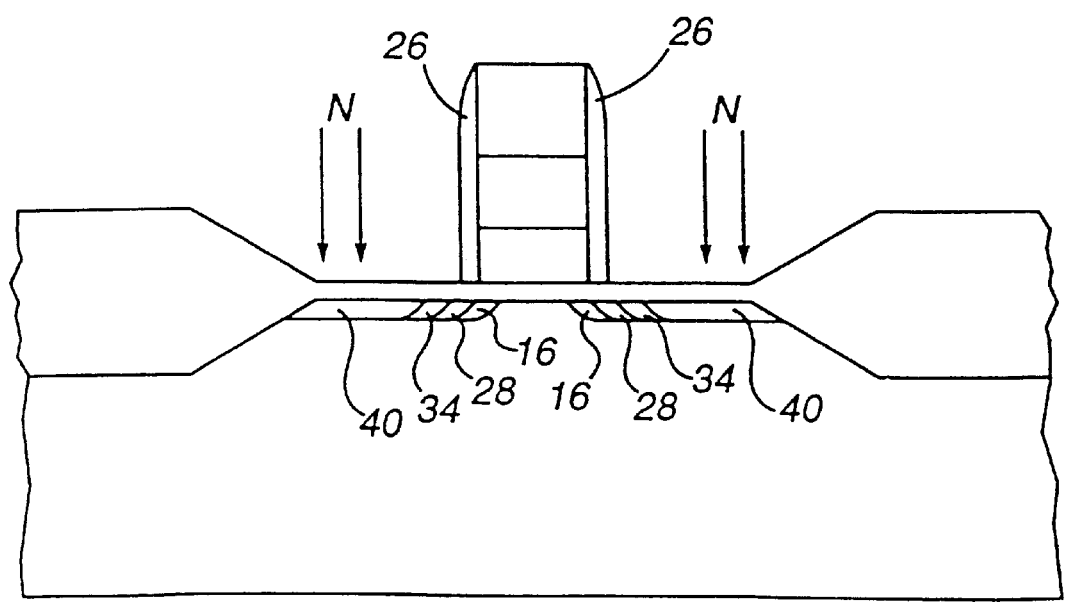

The method described above for fabricating the embodiment depicted in FIG. 1(d) is not the sole method of fabrication possible. For example, the steps described above could be generally reversed, resulting in the process sequence depicted in FIGS. 2(a)–2(d). Referring to FIG. 2(a), gate sidewall spacers 26 are formed prior to creation of the fourth contact subregions 40. Referring to FIG. 2(b), the sidewall spacers 26 have been isotropically or anisotropically etched to decrease their thickness to a desired value prior to creation of the third contact subregions 34. Where the dielectric cap 24 is of the same material as sidewall spacers 26, the thickness of dielectric cap 24 should be sufficient to allow for the isotropic etch and should exceed considerably the thickness of sidewall spacers 26. This process is continued until the sidewall spacers 26 have been etched away entirely prior to creation of the first contact subregions 16. Alternatively, the first contact subregions 16 could be created before the sidewall spacers 26 are etched away entirely. Or, as a further alternative, the first contact subregions 16 could be created before the sidewall spacers 26 are deposited and etched to create contact subregions 28, 34, and 40, resulting in a method as depicted in FIGS. 3(a)–3(d). The two latter methods have the advantage of leaving a portion of sidewall spacers 26 as final spacers, obviating an additional step of creating final spacers.

It should be noted that a primary benefit of the present invention is a reduction of the peak lateral electric field that occurs close to the interface between the substrate 10 and the gate dielectric 14, where hot-carrier injection is most likely to occur. The peak electric field occurs in the substrate on that side of the gate structure 19 where the highest voltage is applied. When a device is operating in its normal mode, the highest voltage will be applied to the drain region. Therefore, it is most important to reduce the peak electric field on the drain side of the gate structure 19. Accordingly, the primary benefits of the present invention can be enjoyed by creating subregions merely on the drain side of the gate structure 19.

Figure 4:
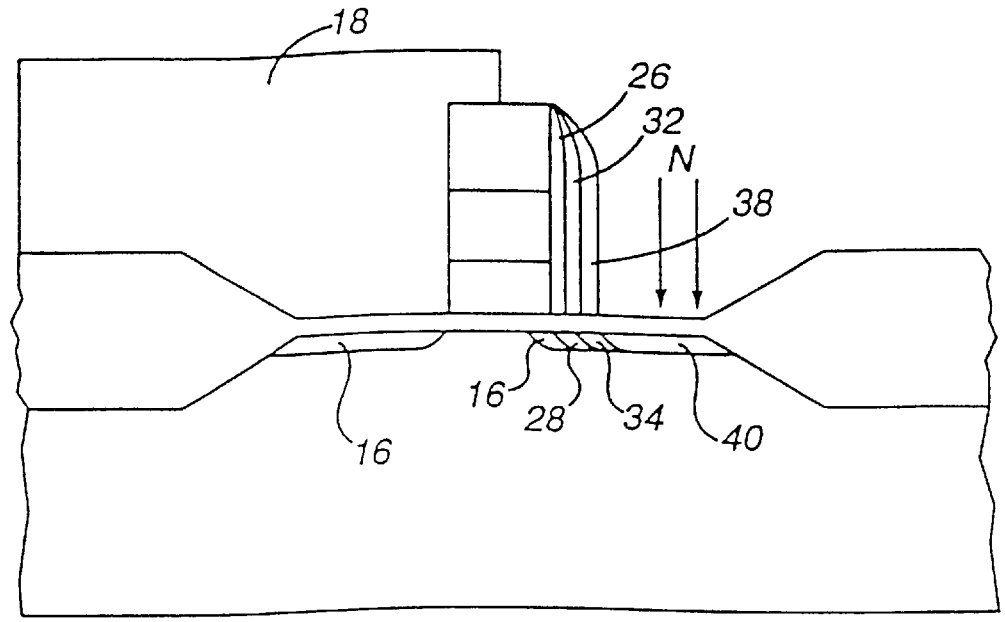
FIG. 4 is a schematic cross-sectional view of a semiconductor wafer, on which four N-type drain subregions, but only one N-type source region, have been formed according to an embodiment of the present invention.

It follows that the embodiment depicted in FIG. 1(d) may be modified to that depicted in FIG. 4, utilizing methods well known in the art. In this embodiment, multiple subregions are formed in the substrate 10 on only one side of the gate structure 19, which side can be used as the drain side of the device. One disadvantage to the embodiment depicted in FIG. 4 is that an extra mask would be required to form a dopant barrier 18 over contact region 16 on the source side of gate structure 19 during the introduction of N-type dopants into contact subregions 28, 34 and 40 on the drain side of gate structure 19. The dopant barrier 18 could comprise a dielectric material or simply a layer of photoresist. However, this method has the added advantage of permitting the tailoring of devices for different applications using the same implant process.

Figure 5:
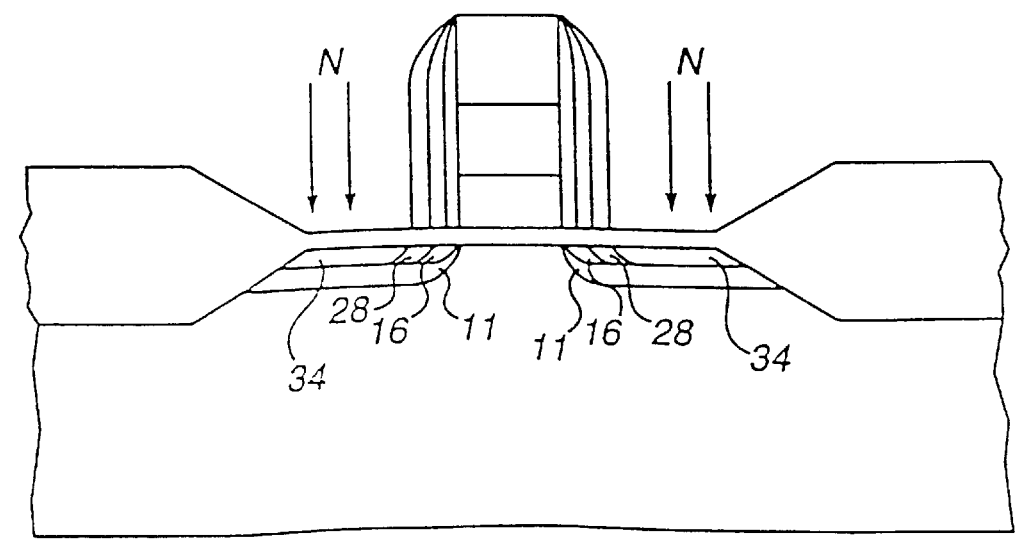
FIG. 5 is a schematic cross-sectional view of a semiconductor wafer, on which one deep P-type anti-punchthrough region and four shallow N-type subregions have been formed at each source and drain region according to an embodiment of the present invention.

It further should be noted that the first contact subregions 16, as depicted in FIGS. 1–4, need not be created in the absence of the first gate sidewall spacers 26. There may be instances where it will not be desirable for the first contact subregions 16 to be generally aligned with the gate sidewalls 21. For example, a manufacturer may wish to exercise greater control over the lateral spacing of the first contact subregions 16 by creating them so that they are generally aligned with the first sidewall spacers 26. Further, first contact subregions 16 can extend into and lie under gate structure 19. Moreover, prior to creating the N-type first contact subregions 16, a manufacturer may wish to create P-type anti-punchthrough regions that are generally aligned with the gate sidewalls 21. Such anti-punchthrough regions are commonly utilized to improve the minimum voltage at which the depletion regions of the source and drain will overlap and, thereby, short out the device. An embodiment of the present invention that includes one P-type anti-punchthrough region 11 and three N-type contact subregions 16, 28 and 34 for each source and drain region is depicted in FIG. 5.

Figure 6:
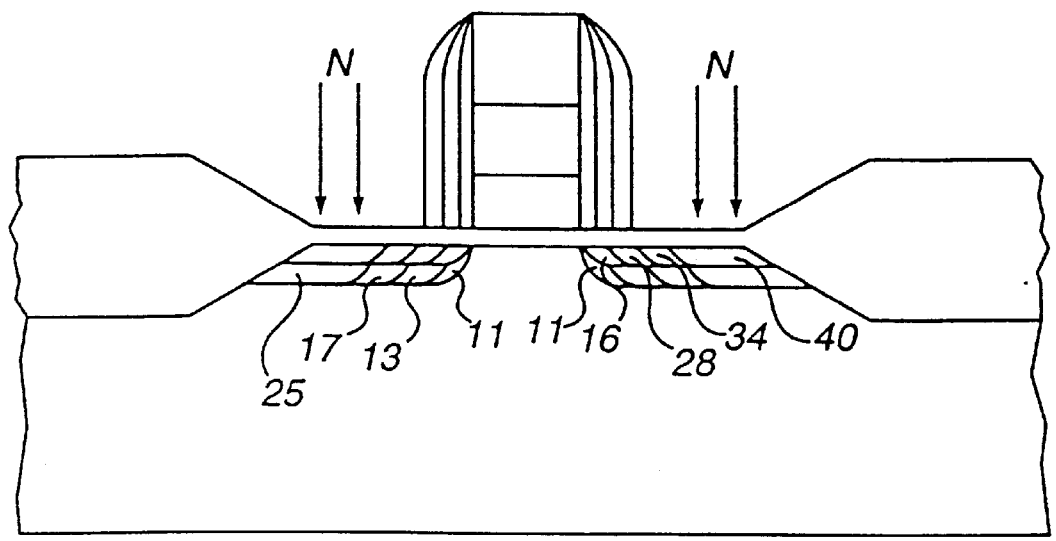
FIG. 6 is a schematic cross-sectional view of a semiconductor wafer, on which four deep P-type anti-punchthrough regions and four shallow N-type subregions have been formed at each source and drain region according to an embodiment of the present invention.

The P-type anti-punchthrough regions can have a greater depth than do the N-type contact subregions. If ion implantation is used, a deeper P-type anti-punchthrough region could be formed by implanting the region with a greater energy than that of the N-type contact subregion implant. For example, P-type anti-punchthrough regions 11 and N-type contact subregions 16, each aligned to the gate sidewalls 21, could be created prior to the formation of the first gate sidewall spacers 26. Moreover, the creation of a deeper P-type anti-punchthrough subregion 11, 13, 17 or 25 could accompany the creation of each of the N-type contact subregions 16, 28, 34 and 40, respectively, so as to create a P-type dopant concentration gradient beneath the N-type dopant concentration gradient, as depicted in FIG. 6. The resultant graduated P-type dopant profile would improve performance over conventional anti-punchthrough regions by, e.g., providing an additional degree of freedom with which to match device performance with device requirements. An anti-punchthrough region, with or without subregions, also can be applied to the one-sided implanted gate structure, described earlier, with such region being utilized either on both sides or on the side having multiple contact subregions.

Figure 7:
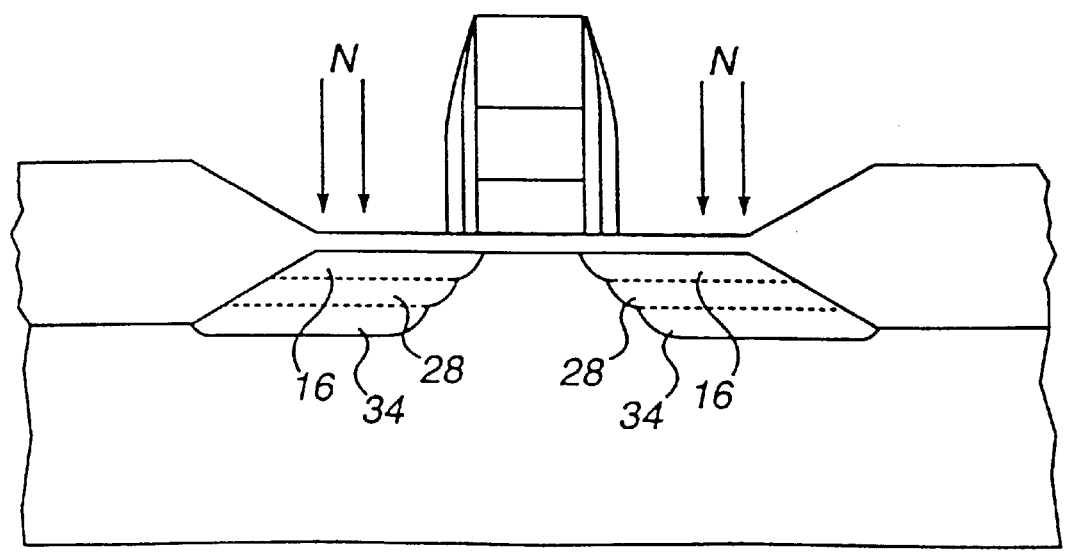
FIG. 7 is a schematic cross-sectional view of a semiconductor wafer, on which three N-type subregions of varying depths have been formed at each source and drain region according to a first embodiment of the present invention.
Figure 8:
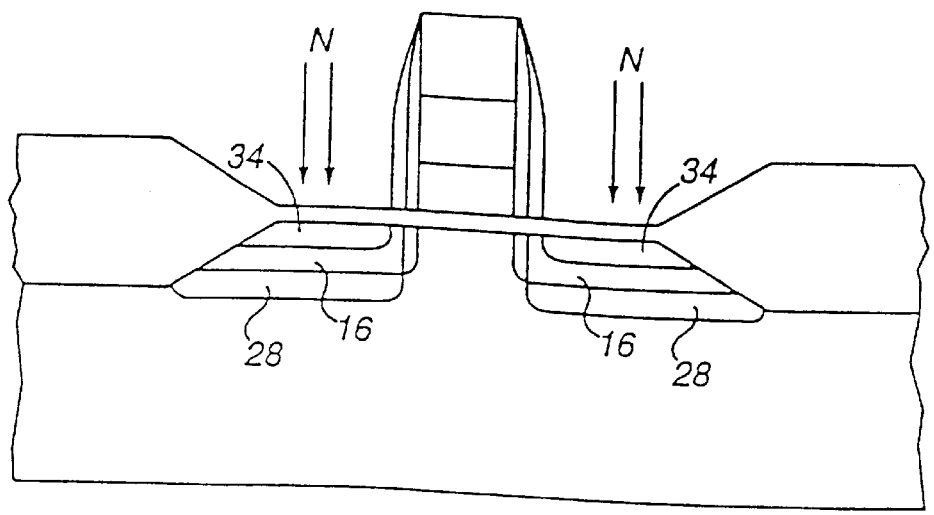
FIG. 8 is a schematic cross-sectional view of a semiconductor wafer, on which three N-type subregions of varying depths have been formed at each source and drain region according to a second embodiment of the present invention.

Although the depth of the contact subregions are the same in the embodiments depicted in FIGS. 1–6, this need not be the case. Two alternative embodiments of the present invention are depicted in FIGS. 7–8. Referring to FIG. 7, the depth of the first contact subregions 16 is less than the depth of the second contact subregions 28 and the depth of the third contact subregions 34. Moreover, the depth of the second contact subregions 28 is less than the depth of the third contact subregions 34. If ion implantation is used, the depths can be varied by merely varying the energy of the implants. Referring to FIG. 8, the depth of the first contact subregions 16 is less than the depth of the second contact subregions 28 and greater than the depth of the third contact subregions 34. Because the primary benefits of the present invention arise from the lateral dopant concentration gradient in the substrate close to the interface between substrate 10 and gate dielectric 14, the primary significance of the embodiments depicted in FIGS. 7–8 is to illustrate that the depth of the contact subregions need not be precisely controlled to retain the numerous benefits of the present invention. The same principles apply to the p-type anti-punchthrough regions.

Figure 9:
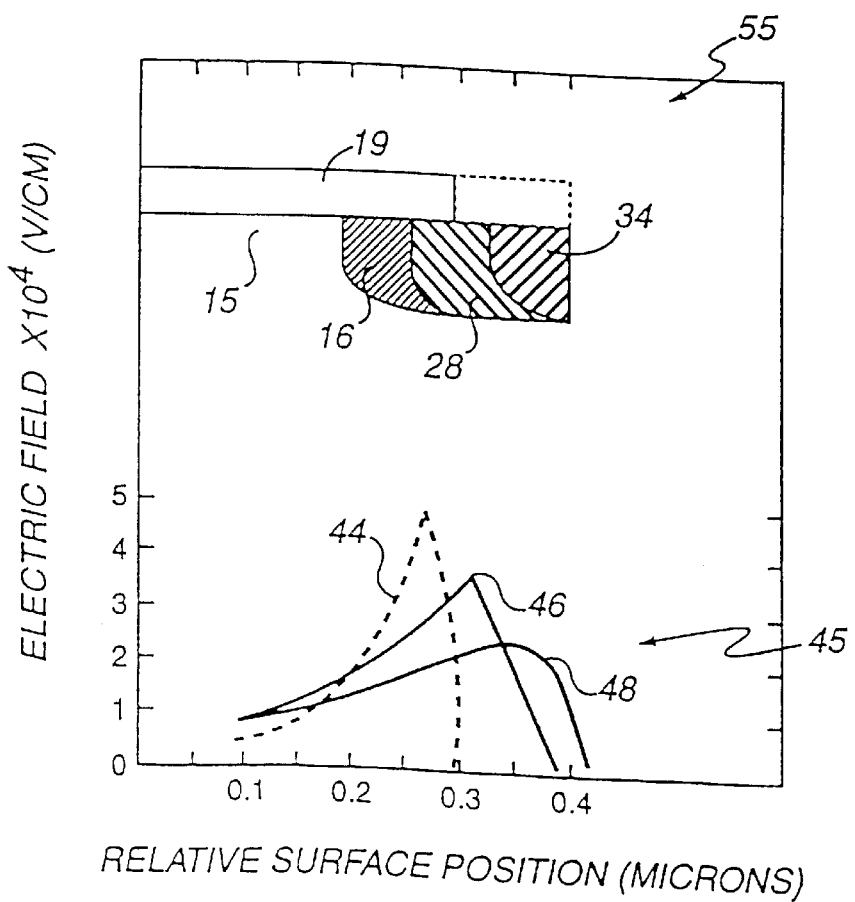
FIG. 9 is a graph illustrating electric field profiles and doping profiles at various lateral positions on the substrate-gate dielectric interface for a conventional MOSFET, a standard LDD FET and an embodiment of the present invention.

Referring to FIG. 9, electric field profiles 45 represent the strength of the electric field at various lateral positions at the interface between the substrate and gate dielectric, measured from the midpoint of the channel region, for a sample conventional MOSFET, profile 44, a standard LDD FET, profile 46 and an embodiment of the present invention, profile 48. Regions 55 represent the lateral position of relevant circuit structures, namely, a gate structure 19, a channel region 15, a first contact subregion 16, a second contact subregion 28 and a third contact subregion 34. The scale in FIG. 9 is relative to the dimensions of the particular device. Profiles are reduced accordingly for smaller device dimensions.

It is immediately apparent from FIG. 9 that the present invention provides a peak field that is both reduced in magnitude and located farther from the gate structure 19 relative to the prior art. Both the reduced magnitude and the increased lateral displacement of the peak electric field mitigates the hot carrier effect by reducing the maximum kinetic energy of electrons that are conducted across the channel region close to the interface between the substrate and the gate dielectric. It also can be appreciated from FIG. 9 that as the number of subregions created within the contact region increases, the drop in voltage over the contact region becomes increasingly gradual, resulting in peak fields of lower magnitude and of greater distance from the gate structure 19.

As is true for standard LDD FETs, it is difficult to derive a quantitative model for the amount of voltage drop over an individual contact subregion. Nevertheless, the following equation, as is known in the art, is typically used to express the series resistance, $R_n$, of an individual contact subregion for a standard LDD device:

$$R_n = ZL_n/q\mu_n N_D r_j,$$

where $L_n$ is the effective lateral length of contact subregion n, q is a constant that denotes the charge of an individual electron, i.e., $1.602 \times 10^{-19}$ coulombs, $\mu_n$ is the electron mobility in contact subregion n, and $N_D$ is the dopant concentration in contact subregion n. Under the present invention, the effective $L_n$ is reduced and $N_D$ is better controlled, resulting in an overall lower series resistance.

Although the present preferred embodiment of the invention has been described in the context of conventional silicon wafer technology, the present invention, including its preferred embodiment, could be utilized in conjunction with silicon-on-insulator ("SOI") wafer technology. In a SOI wafer, the contact subregions could extend all the way through the silicon substrate to the dielectric layer.

Each U.S. Patent referenced herein is hereby incorporated by reference thereto as if set forth in its entirety. Although we have illustrated and described a present preferred embodiment of the invention and variations thereon, the invention is not limited thereto but may be embodied otherwise within the scope of the following claims.

We claim:

1. A method of forming a transistor on a substrate, comprising the following steps:

forming a dielectric layer overlying the substrate;

forming a gate structure overlying the dielectric layer, the gate structure having a first sidewall and a second sidewall, whereby a first contact region, a channel region and a second contact region are defined within the substrate;

forming first and second contact subregions within the second contact region, each contact subregion having a dopant concentration that differs from that of the other contact subregion; and forming an anti-punchthrough region underlying the second contact region, wherein the step of forming the anti-punchthrough region comprises the step of forming a first anti-punchthrough subregion and the step of forming a second anti-punchthrough subregion, wherein the first anti-punchthrough subregion is formed below and in alignment with the first contact subregion, and wherein the second anti-punchthrough subregion is formed below and in alignment with the second contact subregion, each anti-punchthrough subregion having a dopant concentration that differs from that of the other anti-punchthrough subregion.

2. A method of forming a transistor on a substrate, comprising the following steps:

forming a dielectric layer overlying the substrate;

forming a gate structure overlying the dielectric layer, the gate structure having a first sidewall and a second sidewall, whereby a first contact region, a channel region and a second contact region are defined within the substrate;

forming first, second and third contact subregions within the second contact region, each contact subregion having a dopant concentration that differs from that of the other two contact subregions; and forming an anti-punchthrough region underlying the second contact region, wherein the step of forming the anti-punchthrough region comprises the step of forming a first anti-punchthrough subregion, the step of forming a second anti-punchthrough subregion, and the step of forming a third anti-punchthrough subregion, wherein the first anti-punchthrough subregion is formed below and in alignment with the first contact subregion, the second anti-punchthrough subregion is formed below and in alignment with the second contact subregion, and the third anti-punchthrough subregion is formed below and in alignment with the third contact subregion, each anti-punchthrough subregion having a dopant concentration that differs from that of the other two anti-punchthrough subregions.

* * * * *